(12) United States Patent  
Kuboyama et al.

(10) Patent No.: US 7,619,278 B2
(45) Date of Patent: Nov. 17, 2009

(54) SEMICONDUCTOR MEMORY DEVICE

(75) Inventors: Kenichi Kuboyama, Kanagawa (JP); Kohji Kanamori, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 458 days.

(21) Appl. No.: 11/410,091

(22) Filed: Apr. 25, 2006

(65) Prior Publication Data
US 2006/0244040 A1 Nov. 2, 2006

(30) Foreign Application Priority Data
Apr. 28, 2005 (JP) ............... 2005-131593

(51) Int. Cl.
*H01L 29/788* (2006.01)
(52) U.S. Cl. .......... 257/326; 257/E21.68; 438/258
(58) Field of Classification Search .......... 257/314, 257/315, 316, 326, E21.68
See application file for complete search history.

(56) References Cited

U.S. PATENT DOCUMENTS 5,386,132 A * 1/1995 Wong .................. 257/316

FOREIGN PATENT DOCUMENTS

JP 3249811 11/2001

* cited by examiner

*Primary Examiner*—Jerome Jackson, Jr.
*Assistant Examiner*—Paul A Budd
(74) *Attorney, Agent, or Firm*—McGinn IP Law Group, PLLC

(57) ABSTRACT

A semiconductor-memory device that reduces leak off due to miniaturization of memory cells, and comprises as a single unit cell: a substrate 1 having a trench section 1a; a selector gate 3 that is located via an insulating film 2 on the substrate adjacent to the trench section 1a; a first well 1b that is formed on the surface of the substrate 1 below the selector gate 3; a floating gate 6 that is located via an insulating film 8a on the surface of the bottom section and sidewall section of the trench section 1a; a second well 1c that is formed on the surface of the bottom section of the trench section 1a below the floating gate 6; a first diffusion area 7a that is formed on the surface of the bottom section of the trench section 1a; and a control gate 11 located via an insulating film 8 on top of the floating gate 6; and where the area near the sidewall surface and bottom surface of the trench section 1a forms a channel in the selector gate 3; and the impurity density of the first well 1b is not more than the impurity density of the second well 1c.

19 Claims, 19 Drawing Sheets (PRIOR ART 1)

(READING OPERATION)

FIG. 18        PRIOR ART (ERASING OPERATION)

SEMICONDUCTOR MEMORY DEVICE

FIELD OF THE INVENTION

This invention relates to a semiconductor-memory device having cell transistors, and to the manufacturing method thereof, and particularly to a semiconductor-memory device, which stores a plurality of bits of information per cell, and to the manufacturing method thereof.

BACKGROUND OF THE INVENTION

Among conventional semiconductor-memory devices, a non-volatile semiconductor-memory device having cell transistors as shown in FIG. 14 is known as a non-volatile semiconductor-memory device that stores a plurality of bits of information per cell (prior art 1). The non-volatile semiconductor-memory device of prior art 1 comprises: two strip-shaped reverse-conductive areas 123a, 123b that are formed on the top layer of a semiconductor substrate 121, on opposite sides of a strip-shaped conductive semiconductor layer 124a; a first floating gate 127a that is formed via an insulating film 122a such that it extends from the top of one of the reverse-conductive areas 123a over one of the side surfaces of the semiconductor layer 124a; a second floating gate 127b that is formed via an insulating film 122b such that is extends from the top of the other reverse-conductive area 123b over the other side surface of the semiconductor layer 124a; and a control gate 130a that is formed via an insulating film 128 on the top surface of the semiconductor layer 124a (refer to Patent Document 1). With the non-volatile semiconductor-memory device of this prior art 1, reliability of the construction itself is high, and it is possible to maintain localization of a captured charge even when writing a large amount, and to suppress fluctuation in the threshold voltage. Here, miniaturization is possible just by the overlapping portions between the floating gates 127a, 127b and the reverse-conductive areas 123a, 123b.

Also, among conventional semiconductor-memory devices, a non-volatile semiconductor-memory device as shown in FIG. 15 and FIG. 16 is known (prior art 2). The non-volatile semiconductor-memory device of this prior art 2 comprises: a first diffusion area 207a and a second diffusion area 207b that are arranged in a memory cell on the surface of the substrate so that they are parallel and separated from each other; a selector gate 203 that is located via an insulating film 202 on the substrate 201 in the area between the first and second diffusion areas 207a, 207b; and a third diffusion area (221 in FIG. 15) that is located on the surface of the substrate 201 below the selector gate 203 outside the cell area so that it extends in the direction that crosses the selector gate 203; and having a floating gate 206 that is located via an insulating film 202 in a first area between the first diffusion area 207a and selector gate 203, and in a second area between the second diffusion area 207b and selector gate 203, and a control gate 211 that is located via an insulating film 208 on top of the floating gate 206 and selector gate 203; where the first diffusion area 207a, floating gate 206, control gate 211 and selector gate 203 form a first unit cell, and the second diffusion area 207b, floating gate 206, control gate 211 and selector gate 203 for a second unit cell. In the non-volatile semiconductor-memory device of prior art 2, by applying a positive voltage to the selector gate 203, an inversion layer 220 is formed on the surface of the substrate below the selector gate 203 inside the cell area. The non-volatile semiconductor-memory device of prior art 2 differs from the non-volatile semiconductor-memory device of prior art 1 in that: (1) there is a selector gate 203; (2) an inversion layer 220 is formed below the selector gate 203 inside the cell area when a positive voltage is applied to the selector gate 203; and (3) the area below the floating gate 206 is used as a channel.

The operation of the non-volatile semiconductor-memory device of prior art 2 will be explained using the drawings. FIG. 17 is a drawing for explaining the reading operation (reading operation when no electrons have accumulated in the floating gate) of the semiconductor-memory device of prior art 2. FIG. 18 is a drawing for explaining the writing operation of the semiconductor-memory device of prior art 2. FIG. 19 is a drawing for explaining the erasing operation of the semiconductor-memory device of prior art 2.

Referring to FIG. 17, in the reading operation, in the state in which electrons have not accumulated in the floating gate 206 (erasing state: low threshold voltage), by applying a positive voltage to the control gate 211, selector gate 203 and third diffusion area (221 in FIG. 15), electrons e travel from the second diffusion area 207b along a channel directly below the floating gate 206, and along the inversion layer 220 formed below the selector gate 203 to the third diffusion area (221 in FIG. 15). On the other hand, in the state in which electrons have accumulated in the floating gate 206 (write state: high threshold voltage), there is no channel below the floating gate 206 so no electrons e flow even when a positive voltage is applied to the control gate 211, selector gate 203 and third diffusion area (221 in FIG. 15) (not shown in the figure). Reading is performed by judging data (0/1) according to whether or not electrons e flow.

Referring to FIG. 18, in the writing operation, by applying a high positive voltage to the control gate 211 and second diffusion area 207b, and applying a low positive voltage so that a current of about 1 μA flows in the memory cell of the selector gate 203, electrons e travel from the third diffusion area (211 in FIG. 15) along the inversion layer 220 that is formed below the selector gate 203 to the second diffusion area 207b. When this happens, since part of the electrons e have high energy due to the electric field at the boundary between the selector gate 203 and floating gate 206, they pass through the insulating film 205 (tunnel oxidation film) below the floating gate 206 and infuse into the floating gate 206.

Referring to FIG. 19, in the erasing operation, by applying a high negative voltage to the control gate 211 and applying a high positive voltage to the substrate 201, electrons e are drawn away from the floating gate 206 and pass through the insulating film 205 (tunnel oxidation film) below the floating gate 206 to the substrate 201.

In comparison with the non-volatile semiconductor-memory device of prior art 1, with this non-volatile semiconductor-memory device of prior art 2, construction is such that by performing reading using the selector gate 203 channel as a drain, reading is performed of a target memory node of an independent unit cell, which faces a non-target memory node and is located on the other side of the selector gate 203, without reading the non-target memory node of the other unit cell, and thus essentially functions as a 1-bit cell, so it advantageous in that it is possible to obtain stable circuit operation.

[Patent Document 1] Japanese Patent No. 3,249,811

The entire disclosure thereof being incorporated herein by reference thereto.

SUMMARY OF THE DISCLOSURE

However, the non-volatile semiconductor-memory device of prior art 2 has the following problems.

First, as a cell is made more compact, the leak off from the memory cell increases when a positive voltage is applied to the selector gate 203. The reason for this is that the channel length between the inversion layer 220, which is formed below the selector gate 203, and the second diffusion layer 207b become shorter in proportion to the reduction of the cell size, thus making it difficult to control leak off.

Second, when trying to control punch through between the inversion layer 220 and the second diffusion area 207b during the writing operation, the ON current Ion stops flowing. The reason for this is that because the inversion layer 220 and the second diffusion layer 207b are located at the same level on the substrate 201, when the cell is made more minute, it becomes difficult to separate the impurity density in the well 201b of the substrate 201 below the selector gate 203 and the impurity density in the well 201b of the substrate 201 below the floating gate 206 (area between the inversion layer 220 and the second diffusion area 207b) and to form the cell, so there is a trade off between whether to suppress punch through or improve the ON current Ion. In other words, there is a trade off that in order to suppress punch through, it is necessary to increase the impurity density in the well 201b of the substrate 201 below the floating gate 206 (area between the inversion layer 220 and second diffusion area 207b), however, the threshold voltage value of the selector gate transistor increases, and there is a drop in current when reading. Thus there is much to be desired in the art.

Accordingly, it is an object of the present invention to reduce leak off as the memory cell is made more minute.

According to one aspect of the present invention, there is provided a semiconductor-memory device comprising one cell unit or a plurality of cell units. The one cell unit comprises: a substrate having a trench section of a specified depth; a selector gate that is located via a first insulating film in a first area on the substrate that is adjacent to the trench section; a first well that is formed on the surface of the substrate below the selector gate; a floating gate that is located via a second insulating film in a second area on the surface of the bottom section and sidewall of the trench that is adjacent to the first area; a second well that is formed on the surface of the bottom section of the trench section that is below the floating gate; a first diffusion area that is formed in a third area on the surface of the bottom section of the trench section and adjacent to the second area; and a control gate that is located via a third insulating film on top of the floating gate. In the one cell, the control gate three-dimensionally crosses over the selector gate; a second diffusion area is formed in a fourth area on the surface of the substrate located in an extending section of the control gate; the area near the sidewall surface and bottom surface of the trench section in the selector surface forms a channel; and the impurity density of the first well is not more than the impurity density of the second well.

According to a second aspect of the present invention, there is provided a semiconductor-memory device. The semiconductor-memory device is characterized by comprising: a substrate in which a first trench section and second trench section having a specified depth are placed so that they are separated from and parallel to each other; a selector gate that is located via a first insulating film in a first area on the substrate adjacent to the first trench section and second trench section; a first well that is formed on the surface of the substrate below the selector gate; a first floating gate that is located via a second insulating film in a second area on the surface of the bottom section and sidewall section of the first trench section that is adjacent to the first area; a second floating gate that is located via a third insulating film in a third area on the surface of the bottom section and sidewall section of the second trench section that is adjacent to the first area; a second well that is formed on the surface of the bottom section of the first trench section below the first floating gate, and located on the surface of the bottom section of the second trench section below the second floating gate; a first diffusion area that is adjacent to the first well and is formed on the surface of the bottom section of the first trench section; a second diffusion area that is adjacent to the first well and is formed on the surface of the bottom section of the second trench section; a fourth insulating film that is located on top of the selector gate; a control gate that is located via a fifth insulating film on top of the first floating gate, the second floating gate and the fourth insulating film; and a third diffusion area that is located in a fourth area on the surface of the substrate in an extended section of the selector gate and extends in a direction that crosses the selector gate. The first diffusion area, a the first floating gate, the control gate and the selector gate form a first unit cell; the second diffusion area, the second floating gate, the control gate and the selector gate form a second unit cell; the area near the surface of the sidewall and bottom surface of the first trench section and the second trench section in the selector gate forms a channel; and the impurity density of the first well is not more than the impurity density of the second well.

According to a third aspect of the present invention, there is provided a semiconductor-memory device. The semiconductor-memory device is characterized by comprising: a trench having a specified depth; an embedded diffusion area that is deeper than the bottom section of the trench; an embedded selector gate between trenches and having a depth that is more shallow than the specified depth; a first well that is located directly below the selector gate; a memory node that extends from the side surface running along the extended direction of the selector gate and passing over the side surface of the trench to reach the bottom surface of the trench; a second well that is located in an area directly below the selector gate and adjacent to the diffusion area; and a control node that controls the selector gate and the memory node; wherein the impurity density of the second well is not less than the impurity density of the first well.

According to a fourth aspect of the present invention, there is provided a method for manufacturing a semiconductor-memory device. The method is characterized by comprising steps of: forming a first well on the surface of a substrate; forming a first insulating film, first semiconductor film and second insulating film in order from the bottom on the substrate; forming a selector gate by selectively etching specified areas of the second insulating film and the first semiconductor film; forming trench sections by etching the first insulating film by self alignment using the second insulating film as a mask, and etching the substrate to a specified depth; forming a second well on the surface of the bottom section of the trench section so that the impurity density thereof is not less than the impurity density of the first well; forming a third insulating film over the entire surface of the substrate on which the trench sections are formed; depositing a second semiconductor film on the entire surface of the substrate on which the third insulating film is formed, and forming a sidewall-shaped floating gate by etching the sidewall of the trench section, the first insulating film, the selector gate and the second insulating film; and forming a diffusion area by ion implantation on the surface of the bottom section of the trench section by self alignment using the third insulating film and the floating gate as masks.

The meritorious effects of the present invention are summarized as follows.

With this invention (first to fourth aspects; claims 1 to 14) it is possible to reduce leak off from the memory cell even when a positive voltage is applied to the selector gate 203. The reason for that is the channel (channel near the sidewall of the floating gate) exists in the height direction even when the cell size is reduced. This makes it possible to effectively lengthen the channel, so it is possible to reduce leak off from the memory cell.

With this invention (first to fourth aspects; claims 1 to 14) punch through across the drain and source (across the inversion layer and diffusion area) during writing is suppressed. The reason is that the first diffusion area and second diffusion area on the drain side are located such that they are physically lower than the inversion layer on the source side, so it is possible to set the impurity density of the substrate below the floating gate (area between the inversion layer and diffusion area) without affecting the impurity density of the substrate below the selector gate (area where the inversion layer is formed). Also, setting the impurity density of the substrate below the floating gate (area between the inversion layer and diffusion area), so that it is denser than the impurity density of the substrate below the selector gate (area where the inversion layer is formed), is very effective in suppressing punch through. Moreover, the ON current Ion of the memory cell is improved. The reason is that since it is possible to make the impurity density of the substrate below the selector gate (area where the inversion layer is formed) less dense than the impurity density of the substrate below the floating gate (area between the inversion layer and diffusion area), it is possible to lower the channel resistance below the selector gate. In other words, together with being able to prevent punch through by increasing the impurity density of the substrate below the floating gate (area between the inversion layer and diffusion area), it is possible to lower the threshold value of the selector gate by decreasing the impurity density of the substrate below the selector gate (area where the inversion layer is formed), and it is possible to lower the channel resistance of the selector gate. This makes it possible to improve the current when reading a memory cell.

PREFERRED EMBODIMENTS OF THE INVENTION

Embodiment 1

Figure 1:
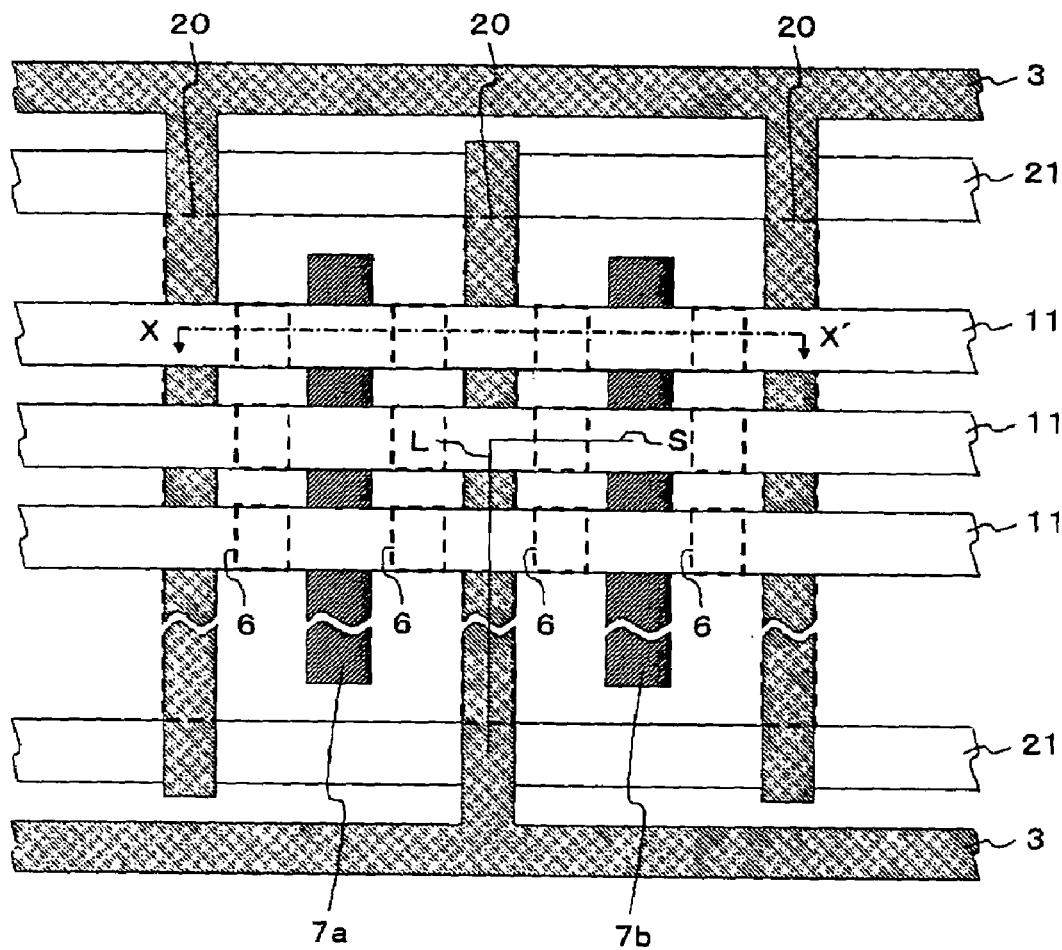
FIG. 1 is a partial plan view that schematically shows the construction of the semiconductor-memory device of a first embodiment of the invention.
Figure 2:
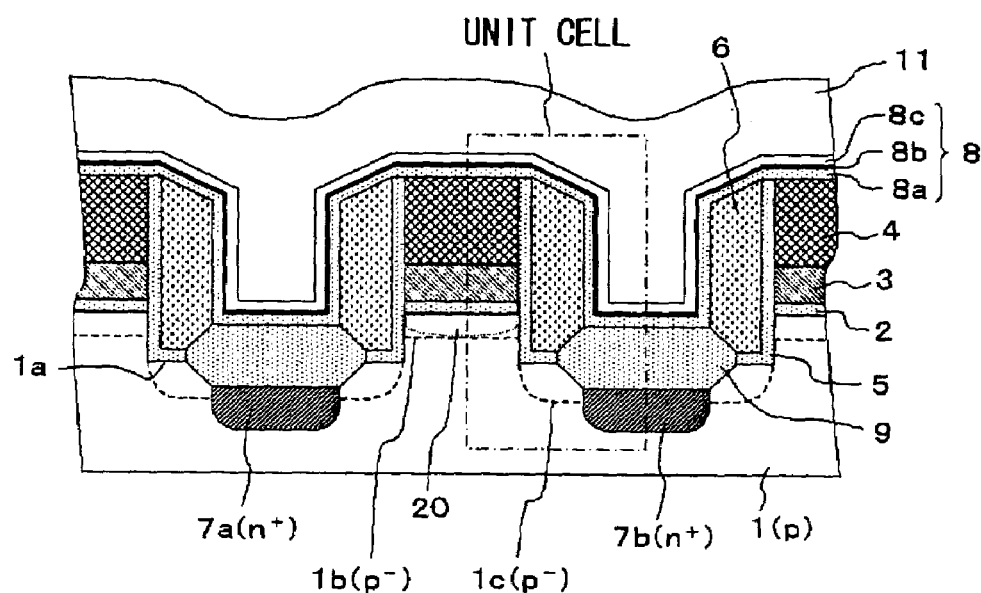
FIG. 2 is a partial cross-sectional view of the section X-X' in FIG. 1 that schematically shows the construction of the semiconductor-memory device of a first embodiment of the invention.

The semiconductor-memory device of a first embodiment of the invention will be explained using the drawings. FIG. 1 is a partial plan view that schematically shows the construction of the semiconductor-memory device of a first embodiment of the invention; and FIG. 2 is a partial cross-sectional view of the section X-X' in FIG. 1 that schematically shows the construction of the semiconductor-memory device of a first embodiment of the invention. FIG. 1 shows a semiconductor-memory device that comprises a plurality of memory cells, however, here only one of those memory cells will be explained.

The semiconductor-memory device is a non-volatile semiconductor-memory device that stores 2 bits of information per cell. The semiconductor-memory device comprises: a substrate 1, insulating film 2, selector gates 3, insulating film 4, insulating film 5, floating gates 6, first diffusion areas 7a, second diffusion areas 7b, insulating film 8, insulating film 9, control gates 11 and third diffusion areas (21 in FIG. 1). One unit cell of the semiconductor-memory device, as indicated by the dot-dash line in FIG. 2, comprises: one second diffusion area 7b, one floating gate 6, a control gate 11, and selector gate 3. A 2-bit cell of the semiconductor-memory device is constructed by arranging two unit cells axisymmetrically so that they share one common selector gate 3. In other words, in FIG. 2, the other unit cell of the 2-bit cell comprises: one first diffusion area 7a, one floating gate 6, a control gate and selector gate 3.

The substrate 1 is a P-type silicon substrate, and it has a trench section 1a having a specified depth in the area between adjacent selector gates 3 (see FIG. 2). It is preferred that the depth of the trench section 1a be not less than 50 nm and not greater than 100 nm from the surface of the substrate 1. The substrate 1 has a first well 1b located below the selector gate 3. The substrate 1 also has a second well 1c located below the floating gate 6. Here the first well 1b is a p− type diffusion area, and the second well 1c is a p− type diffusion area having an impurity density that is greater than the impurity density of the first well 1b. In order to lower the channel resistance (inversion resistance) directly below the selector gate 3 and to obtain an ON current, it is preferred that the impurity density of the first well 1b be not more than the impurity density of the second well 1c. The first well 1b is also called a common-source diffusion area.

Referring to FIG. 1, in the substrate 1, the channel that acts as a connecting path between the second diffusion area 7b and third diffusion area 21 has a first path L that is shaped so that when seen from the top of the substrate 1 it is continuous with the planar shape of the selector gate 3 and runs along a specified direction from the side of one third diffusion area 21, where the end section of the first path L that extends from the side of one third diffusion area 21 is bent, and has a second path S that runs along a second direction that makes a specified angle with respect to the first direction (for example, a right angle), and extends to the side of another second diffusion area 7b. Of the first path L, the channel that is below the selector gate 3 in the cell area becomes an inversion layer 20 when a positive voltage is applied to the selector gate 3. In the second path S, not only the bottom of the trench section 1a in the substrate 1, but also the area of the sidewall section as well is used as a channel area (see FIG. 1 and FIG. 2). Similarly, the channel area that acts as a connecting path between the first diffusion area 7a and third diffusion area 21 has a first path that is shaped so that when seen from the top of the substrate it runs in the lengthwise direction of the selector gate 3 and extends from the side of one third diffusion area 21, the end of the first path being bent, and has a second path that runs in a second direction that forms a specified angle (right angle) with the first direction and extends to the side of the first diffusion area 7a.

An insulating film 2 is formed on top of the substrate 1 between adjacent trench sections 1a. It is possible to use a silicon oxide film as the insulating film 2 (see FIG. 2). The insulating film 2 can also be called the selector-gate insulating film.

The selector gate 3 is an electrically conductive film that is formed on top of the insulating film 2 (see FIG. 2). Polysilicon can be used for the selector gate 3.

An insulating film 4 is formed on top of the selector gate 3 (see FIG. 2).

An insulating film 5 is formed between the sidewall of the insulating film 4, sidewall of the selector gate 3, sidewall of the insulating film 2, sidewall and bottom of the trench section 1a in the substrate, and the floating gate 6. Silicon oxide (oxidized) film can be used for the insulating film 5 (see FIG. 2). This insulating film 5 can also be called the tunnel oxide (oxidized) film.

The floating gate 6 is formed via the insulating film 5 on both sides of the selector gate structure, which comprises the layered substrate 1, insulating film 2, selector gate 3 and insulating film 4 between adjacent trench sections 1a (see FIG. 2). It is possible to use polysilicon, for example, for the floating gate 6. The floating gate 6 is shaped so that when seen from the cross section it has a sidewall shape (see FIG. 2), and it is arranged so that when seen from the top it is island shaped.

The first diffusion area 7a and second diffusion area 7b are n+ type diffusion areas that are formed in a specified area (between adjacent floating gates 6) on the bottom surface of the trench section 1a of the substrate 1, and it is arranged so that it runs in the direction that the selector gate 3 extends (see FIG. 1 and FIG. 2). Due to the relationship with the selector gate 3, the first diffusion area 7a and second diffusion area 7b become a cell transistor drain area during writing, and become a source area during reading, respectively. The first diffusion area 7a and second diffusion area 7b are also called local-bit lines. The impurity density of the first diffusion area 7a and second diffusion area 7b is the same.

The insulating film 8 is an insulating film that is located between the floating gate 6 and control gate 11 (see FIG. 2). An ONO film, which comprises a silicon oxide (oxidized) film 8a, silicon nitride film 8b and silicon oxide (oxidized) film 8c having high insulating capability and a high dielectric constant and is capable of being made into a thin film, can be used for the insulating film 8.

The insulating film 9 is an insulating film that is located between the silicon oxide film 8a and the substrate 1 (second diffusion area 7b) (see FIG. 2). Thermally-oxidized silicon oxide film (thermally-oxidized film), or silicon oxide film formed by the CVD method can be used for the insulating film 9.

The control gate 11 extends in a direction that crosses the lengthwise direction of the selector gate 3, and crosses over the selector gate 3 (see FIG. 1) in the three-dimensional aspect. The control gate 11, at the point where it crosses the selector gate 3, comes in contact with the top surface of the silicon oxide film 8c that is formed on the top layer of the selector gate 3 (see FIG. 2). The control gate 11 is formed via the insulating film 5, floating gate 6 and insulating layer 8 on both sides of the selector gate structure, which comprises the layered substrate 1, insulating film 2, selector gate 3 and insulating film 4 between adjacent trench sections 1a (see FIG. 2). A conductive film, for example, polysilicon can be used for the control gate 11. It is also possible to form refractory metal silicide (not shown in the figure) on the surface of the control gate 11 in order to lower the resistance. The control gate 11 becomes the word line.

The third diffusion area 21 is an n+ type diffusion area, and it becomes a cell-transistor source/drain (see FIG. 1). The third diffusion area 21 extends in the direction that crosses the lengthwise direction of the selector gate 3 outside the cell area, and it three-dimensionally crosses over the selector gate 3. The third diffusion area 21, at the point where it crosses the selector gate 3, is formed on the surface of the substrate 1 directly below the insulating film 2 that is formed on the bottom layer of the selector gate 3 (not shown in the figure).

Next, an example of the method of manufacturing the semiconductor-memory device of this first embodiment will be explained using the drawings. FIG. 3A to FIG. 7B are cross-sectional drawings that schematically show the processes in the method of manufacturing the semiconductor-memory device of this first embodiment of the invention. FIGS. 6A, 6B and FIGS. 7A, 7B are drawings showing the manufacturing processes in order for the sections A, B and C of the substrate shown in FIG. 5C, where the sections A, B and C correspond to the selector gate, floating gate and diffusion area, respectively.

Figure 3A:
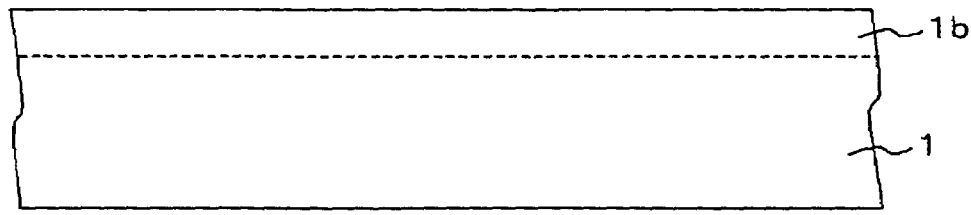
FIGS. 3A, 3B and 3C are cross-sectional views that schematically show the first process of the method for manufacturing the semiconductor-memory device of the first embodiment of the invention.

First, after dividing the substrate 1 into element areas (not shown in the figures), photoresist (not shown in the figure) is formed on the cell area of the substrate 1 in order to form the first well 1b (p− type diffusion area), and that photoresist is used as a mask to form the first well 1b on the surface of the substrate 1, after which the photoresist is removed (see FIG. 3A). Here, during the formation of the first well 1b, boron ions are implanted in order to obtain the required surface density.

Next, photoresist (not shown in the figure) is formed on the substrate 1 in order to form the third diffusion area (21 in FIG. 1), and then using that photoresist as a mask, the third diffusion area (21 in FIG. 1) is formed on the surface of the substrate 1, after which the photoresist is removed (not shown in the figure). Here, formation of the third diffusion area (21 in FIG. 1) is accomplished by implanting a specified dose amount of As ions. After implanting the ions, heat treatment can be performed as necessary in a nitrogen atmosphere.

Figure 3B:
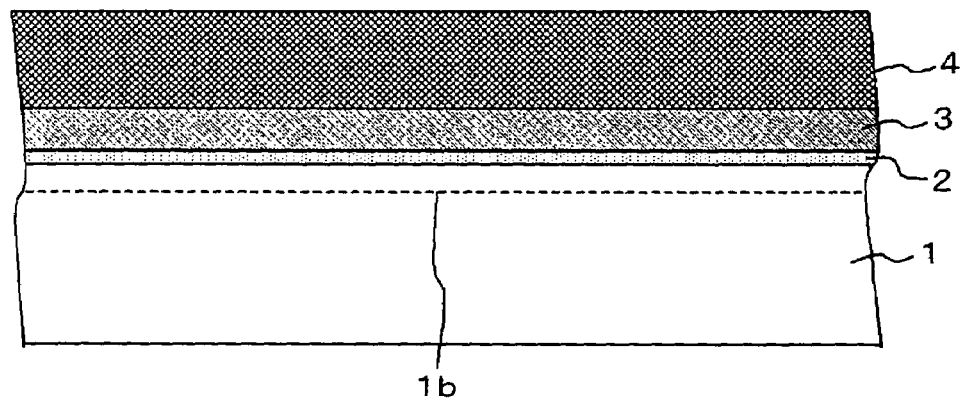

Next, a silicon oxide film 2 is formed on the substrate 1, then a polysilicon film 3 is formed on the silicon oxide film 2, and a silicon nitride film 4 is formed on the polysilicon film 3 (see FIG. 3B). In the formation of the silicon oxide film 2, a film having a thickness of 10 to 15 nm is formed by thermal oxidation. Also, the film thickness of the polysilicon film 3 is, for example, about 60 to 80 nm. It is preferred that the polysilicon film be made into an n-type film by a method such as ion implantation of phosphorus doped polysilicon or arsenic impurities. Also, formation of the silicon nitride film 4 can be accomplished by a CVD method (chemical vapor deposition).

Figure 3C:
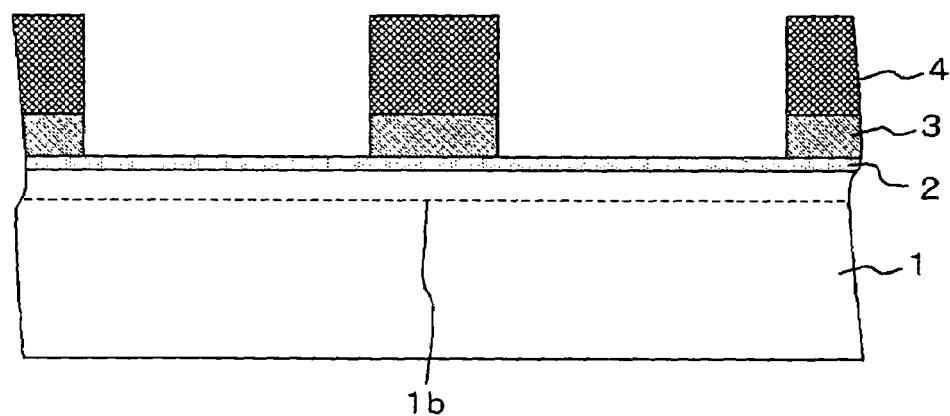

Next, photoresist (not shown in the figure) is formed on top of the silicon nitride film 4 in order to form the selector gate 3, and using that photoresist as a mask, the selector gate 3 is formed by selectively etching the silicon nitride film 4 and polysilicon film 3, after which the photoresist is removed (see FIG. 3C). Here, after forming the selector gate 3, the photoresist is removed, however, depending on the processing characteristics, the photoresist could be removed after forming the trench section 1a in the next process.

Figure 4A:
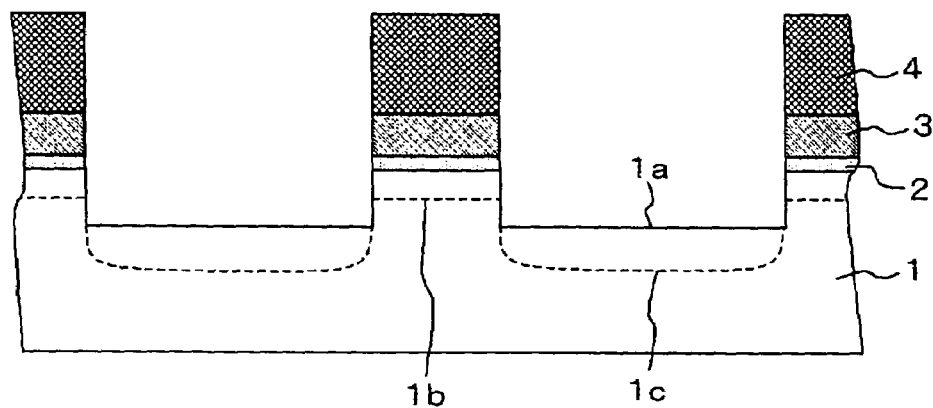
FIGS. 4A, 4B and 4C are cross-sectional views that schematically show the second process of the method for manufacturing the semiconductor-memory device of the first embodiment of the invention.

Next, using the remaining silicon nitride film 4 as a mask, the silicon oxide film 2 is etched by self alignment, and the trench section 1a is formed by etching the substrate 1 a specified depth, after which, the second well 1c is formed on the surface of the trench section 1a in the substrate 1 (see FIG. 4A). Here, in the formation of the second well 1c, in order to suppress punch through between the inversion layer directly below the selector gate 3 and the first diffusion area 7a (local bit) or second diffusion area 7b (local bit), it is preferred that the impurity density be made greater than the impurity density of the first well 1c by implanting boron ions.

Figure 4B:
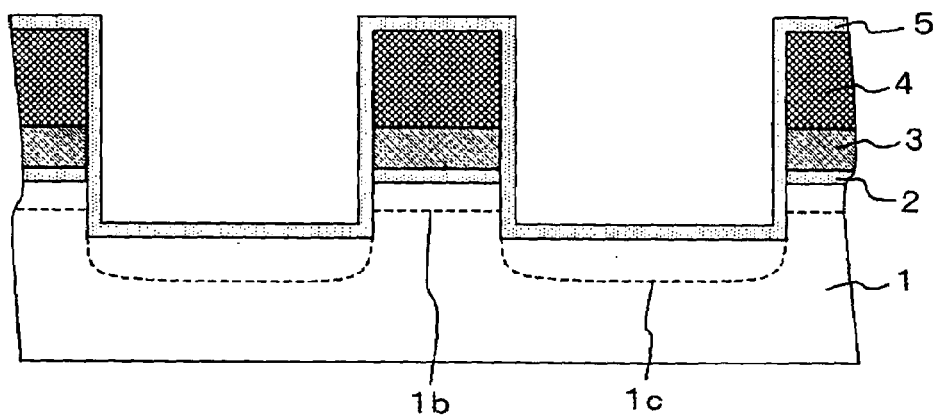

Next, a silicon oxide film 5 is formed over the entire substrate (see FIG. 4B). Here, formation of the silicon oxide film 5 is performed by a method such as CVD (chemical vapor deposition), thermal oxidation, combination of CVD and thermal oxidation, radical oxidation or the like.

Figure 4C:
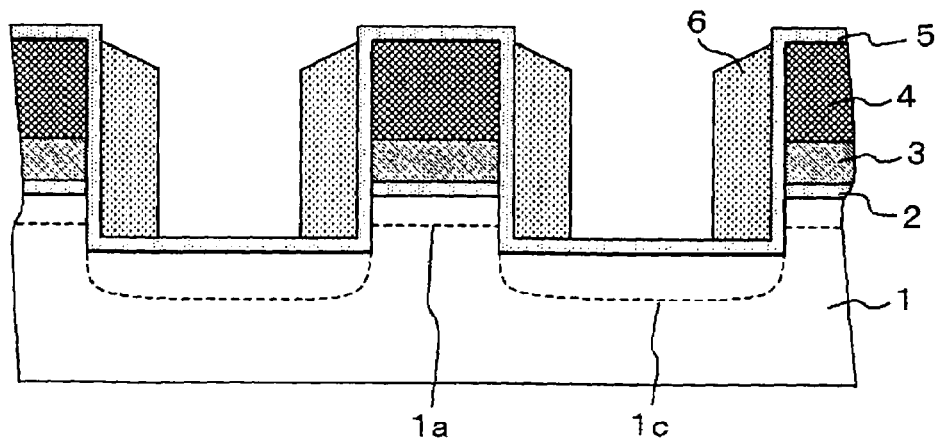

Next, a polysilicon film 6 is deposited over the entire surface of the substrate, and then by etching, a sidewall-shaped and strip-shaped floating gate 6 is formed on the sidewalls of the trench section 1a, silicon oxide film 2, selector gate 3 and silicon nitride film 4 that are covered by the silicon oxide film 5 (see FIG. 4C). Here, deposition of the polysilicon film 6 is performed by CVD. Also, it is preferred that the polysilicon film 6 be n-type film containing phosphorus or arsenic impurities. The floating gate 6 in this stage is formed into a strip shape that runs in the direction toward the back of the drawing in FIG. 4C.

Figure 5A:
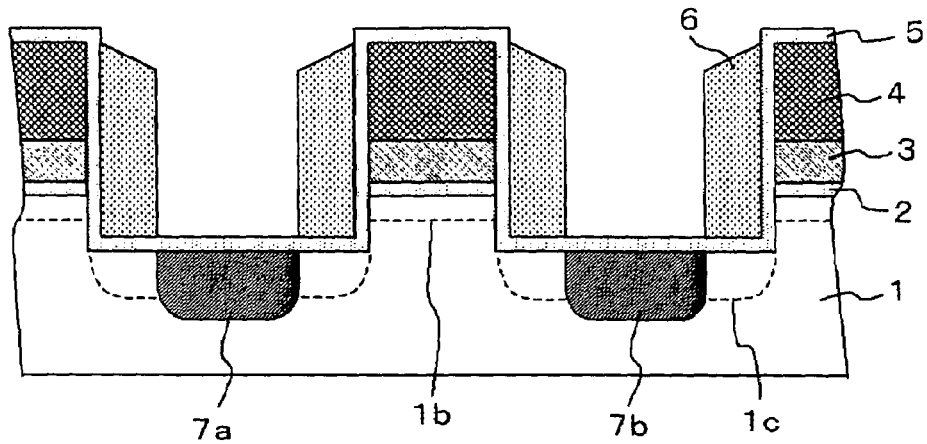
FIGS. 5A, 5B and 5C are cross-sectional views that schematically show the third process of the method for manufacturing the semiconductor-memory device of the first embodiment of the invention.

Next, using the formed silicon oxide film 5 and floating gate 6 as a mask, ion implantation is performed to form the first diffusion area 7a and second diffusion area 7b on the bottom surface of the trench section 1a in the substrate 1 by self alignment (see FIG. 5A). Here, the first diffusion area 7a and second diffusion area 7b are formed by implantation of a $10^{15}$ cm$^{-2}$ dose of As ions. After ion implantation, it is possible to perform heat treatment in a nitrogen atmosphere as necessary.

Figure 5B:
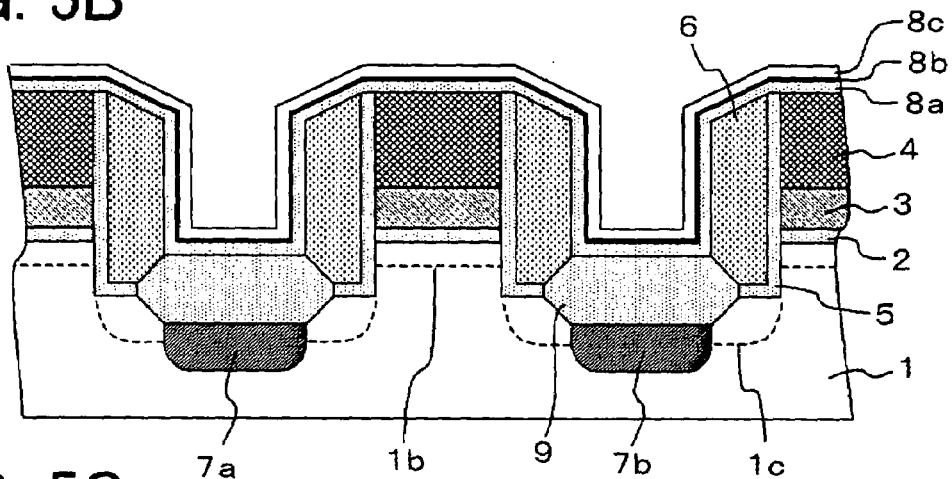

Next, a silicon oxide film (oxidized film) 9 is formed. Here, a silicon oxide film 9 that becomes the bottom oxide film of the trench section 1a is formed. In other words, by thermal oxidation, the oxidation speed is increased by the highly dense impurities (for example As) in the substrate 1 (oxidation enhanced diffusion), and as shown in FIG. 5B, the film thickness of the silicon oxide film 9 is increased on top of the first diffusion area 7a and second diffusion area 7b that are implanted with As ions. It is also possible to form a silicon oxide film 9 by CVD, and then after embedding that silicon oxide film 9 between floating gates, it is possible to flatten the surface of the silicon oxide gate 9 and etch the embedded silicon oxide film 9 to a desired height. Next, a silicon oxide film 8a is formed over the entire substrate by CVD, and then a silicon nitride film 8b is formed so that it covers the adhered silicon oxide film 8a, and a silicon oxide film 8c is formed over that (see FIG. 5B).

Figure 5C:
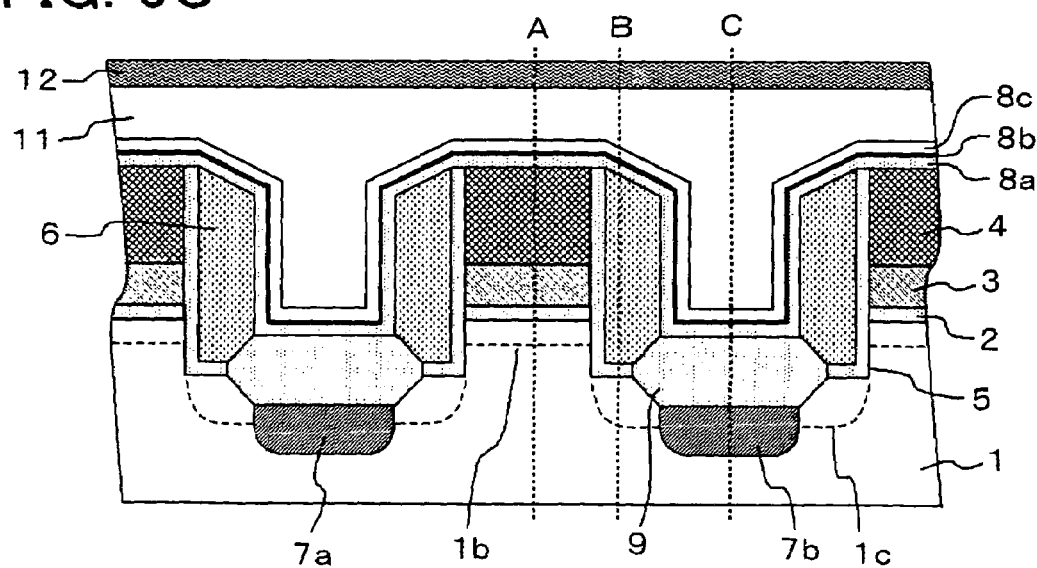

Next, a polysilicon film 11 is formed over the silicon oxide film 8c, and a low-resistance material 12 (WSi, etc.) is adhered to the top surface of the polysilicon film 11 (see FIG. 5C). It is also possible to apply a high refractory silicide process.

Figure 6A:
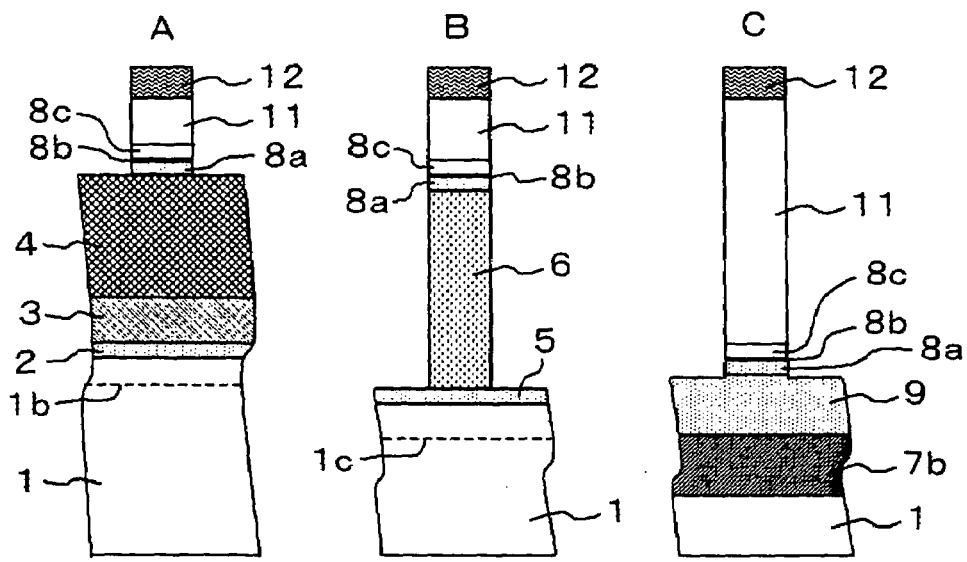
FIGS. 6A and 6B are cross-sectional views that schematically show the fourth process of the method for manufacturing the semiconductor-memory device of the first embodiment of the invention.

Next photoresist (not shown in the figure) is formed on the low-resistance material 12 in order to form a word line, and using that photoresist as a mask, and using a dry etching method or the like, a strip-shaped control gate 11 and island-shaped floating gates 6 are formed by selectively removing the low-resistance material 12, polysilicon film 11, silicon oxide film 8c, silicon nitride film 8b, silicon oxide film 8a and floating gates 6, after which the photoresist is removed (see FIG. 6A). In other words, a pattern is formed by etching with the silicon nitride film 4 and silicon oxide film 2 as a stopper.

Figure 6B:
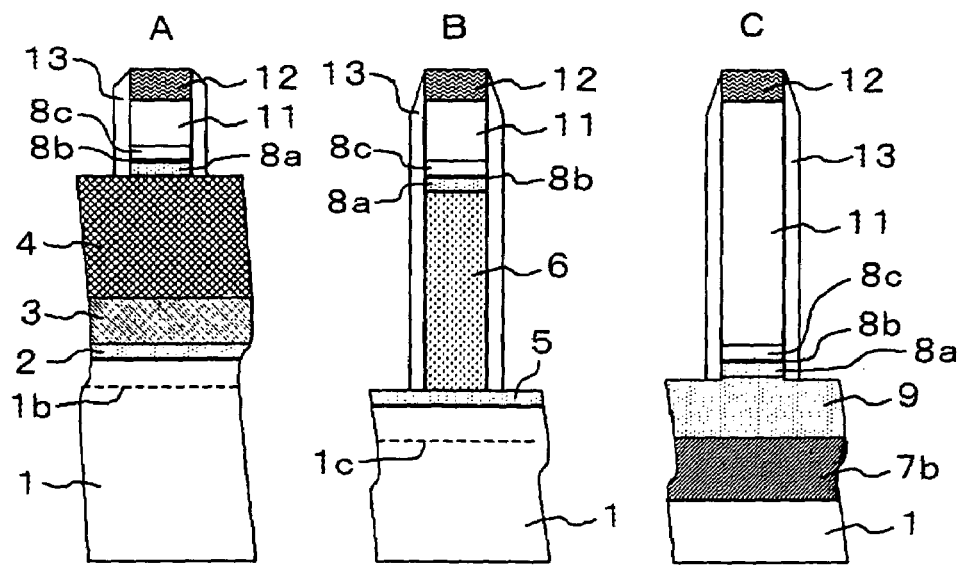

Next, the memory-cell array area is covered with a mask (not shown in the figure) in order to create a peripheral gate (not shown in the figure) in the memory-cell array area (for example create a LDD (Lightly Doped Drain) area), and after the peripheral gate is created, the mask is removed, and sidewalls 13 of silicon oxide film are formed on both sides in the lengthwise direction of the control gate 11 (see FIG. 6B).

Figure 7A:
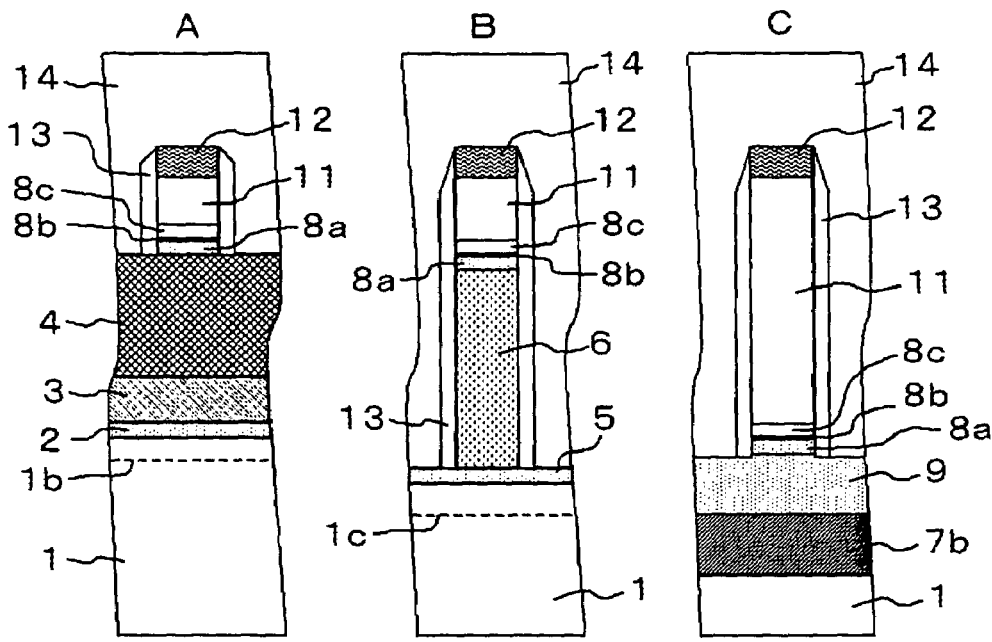
FIGS. 7A and 7B are cross-sectional views that schematically show the fifth process of the method for manufacturing the semiconductor-memory device of the first embodiment of the invention.

Next, the source and drain diffusion areas of the peripheral gate (not shown in the figure) are created, and after that an inter-layer insulating film 14 is formed between layers (see FIG. 7A).

Figure 7B:
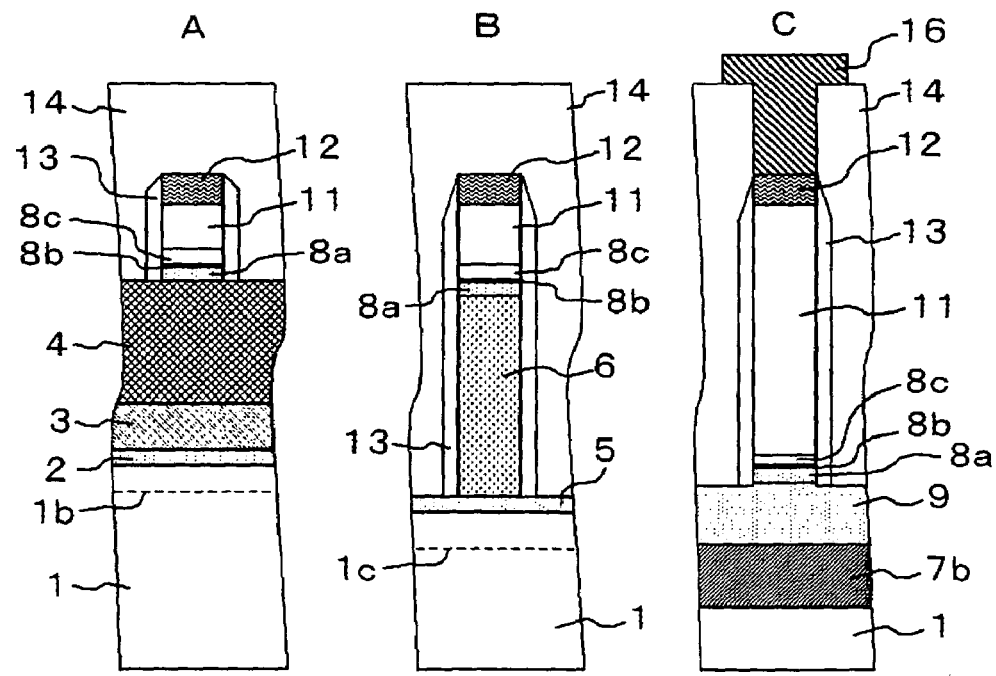

Next, a contact hole that reaches the low-resistance material 12 is formed in the inter-layer insulating film 14, and after that Al wire 16 is formed inside that contact hole (see FIG. 7B).

Figure 8:
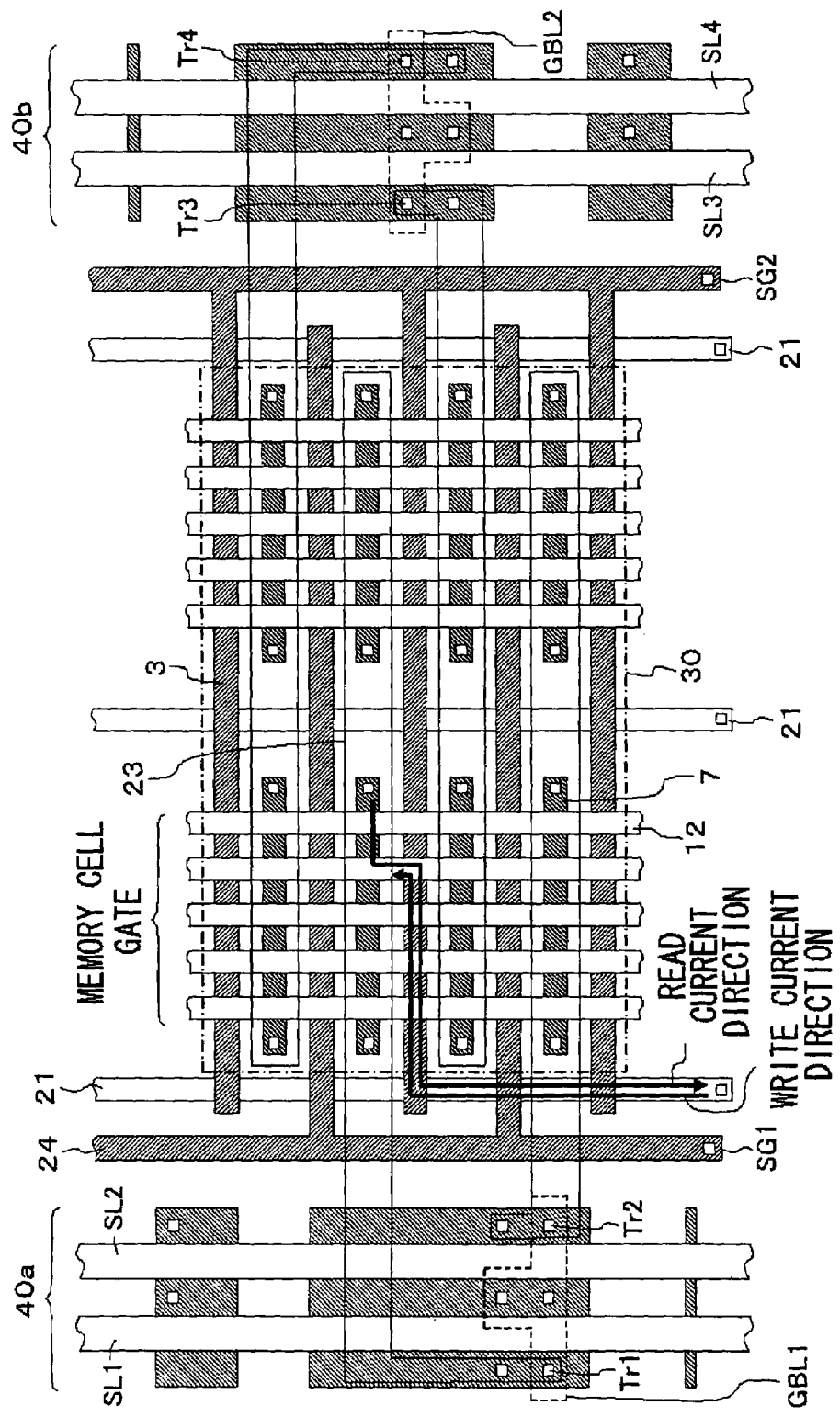
FIG. 8 is a plan view that schematically shows the construction of the memory-cell array of the semiconductor-memory device of the first embodiment of the invention.

Next, the construction of the memory-cell array of the semiconductor-memory device of this first embodiment of the invention will be explained using the drawings. FIG. 8 is a top plan view that schematically shows the construction of the memory-cell array of the semiconductor-memory device of this first embodiment of the invention.

Referring to FIG. 8, the memory-cell array of the semiconductor-memory device of this first embodiment is formed by a plurality of rows of diffusion areas 7 (also called local-bit lines) that extend along one direction of the substrate surface (top layer), and are arranged so that they are separated from each other, and are connected to the bit line by contacts. Also, embedded diffusion areas 21 (correspond to 21 in FIG. 1) are formed on the substrate surface in positions separated from both ends in the lengthwise direction of the plurality of rows of diffusion areas 7, and they extend in a direction that crosses the lengthwise direction of diffusion areas 7. Also, a plurality of word lines 12 is formed on the substrate via an insulating film (not shown in the figure), and they extend in a direction that crosses the lengthwise direction of the diffusion areas 7. Moreover, selector gates 3 are formed on the substrate via an insulating film (not shown in the figure) so that they extend in a direction between the rows of diffusion areas 7, and these selector gates 3 cross over in the three-dimensional (3D) fashion the embedded diffusion areas 21 via an insulating film (not shown in the figure).

In the example shown in FIG. 8, there are Y switches (selection transistor or bank-selection transistor) on both sides of the memory-cell diffusion area (also called the memory-cell area) 40a, 40b.

The Y switch 40a comprises: first and second selection transistors (also called bank-selection transistors) Tr1, Tr2, where the diffusion area that is to become a source or drain is connected via the contact/via holes to the global-bit line GBL1, which is located on the second aluminum wire layer; the gate electrodes are both taken to be selection lines SL1, SL2; and the other diffusion area that is to become a drain or source is connected to the bit line 23, which corresponds to the first aluminum wire layer, via contacts.

The Y switch 40b comprises: third and fourth selection transistors (also called bank-selection transistors) Tr3, Tr4, where one diffusion area that is to become a source or drain that is connected via the contact/via holes to the global-bit line GBL2, which is located on the second aluminum wire layer; the gate electrodes are both taken to be selection lines SL3, SL4; and the other diffusion area that is to become a drain or source is connected to the bit line 23, which corresponds to the first aluminum wire layer, via contacts. The bit line 23 on the first aluminum wire layer that corresponds to the diffusion area 7 on the substrate surface is connected via contacts.

The second and fourth bit lines that are connected to the first and second selection transistors Tr1, Tr2 extend from the side of Y switch 40a along the memory-cell area 30 to the side of Y switch 40b, and the first and third bit lines that are connected to the third and fourth selection transistors Tr3, Tr4 extend from the side of Y switch 40b along the memory-cell area 30 to the side of Y switch 40a.

In the example shown in FIG. 8, the memory-cell array is constructed so that 5 word lines are one unit and form one group, and there are two groups. Of course, in this invention, the construction of the memory-cell array is not limited to construction having two groups in which 5 word lines form one unit.

On both sides of a group of word lines 12 there are embedded diffusion areas 21. There are three embedded diffusion areas for the two groups of word lines 12. By placing embedded diffusion areas on both sides of each group (sub array) of the memory-cell array, the read current is increased as described later.

The selector gates 3 that are located on the substrate of the memory-cell array in between and along the diffusion areas 7 are alternately connected to the two selector gates 24 (SG1, SG2) located on both sides of the memory-cell array 30. The first and second selector-gate terminals SG1, SG2 that are located on both sides of the memory-cell area 30, and the selector gates 3 of the memory-cell area 30 are made from the same conductive material, and are patterned at the same time in the manufacturing process shown in FIG. 3C. In the layout shown in FIG. 8, the first and second selector-gate terminals SG1, SG2 are located between the embedded diffusion area 21 on one side of the memory-cell area 30 and the Y switch 40a, and between the embedded diffusion area 21 on the other side of the memory-cell area 30 and the Y switch 40b, and are parallel in the lengthwise direction of the word lines 12. Selector gates 3 from the first selector-gate terminal SG1 pass through the area between the diffusion areas 7 and extend toward the side of the second selector-gate terminal SG2, passing over the ends of the memory-cell area 30 and embedded diffusion areas 21; and the selector gates 3 pass from the second selector-gate terminal SG2 through the area between the diffusion areas 7 and extend toward the side of the first selector-gate terminal SG1, passing over the ends of the memory-cell area 30 and embedded diffusion areas 21. Of course, in FIG. 8, the embedded diffusion areas 21 are not limited to being embedded-type diffusion areas.

Figure 9:
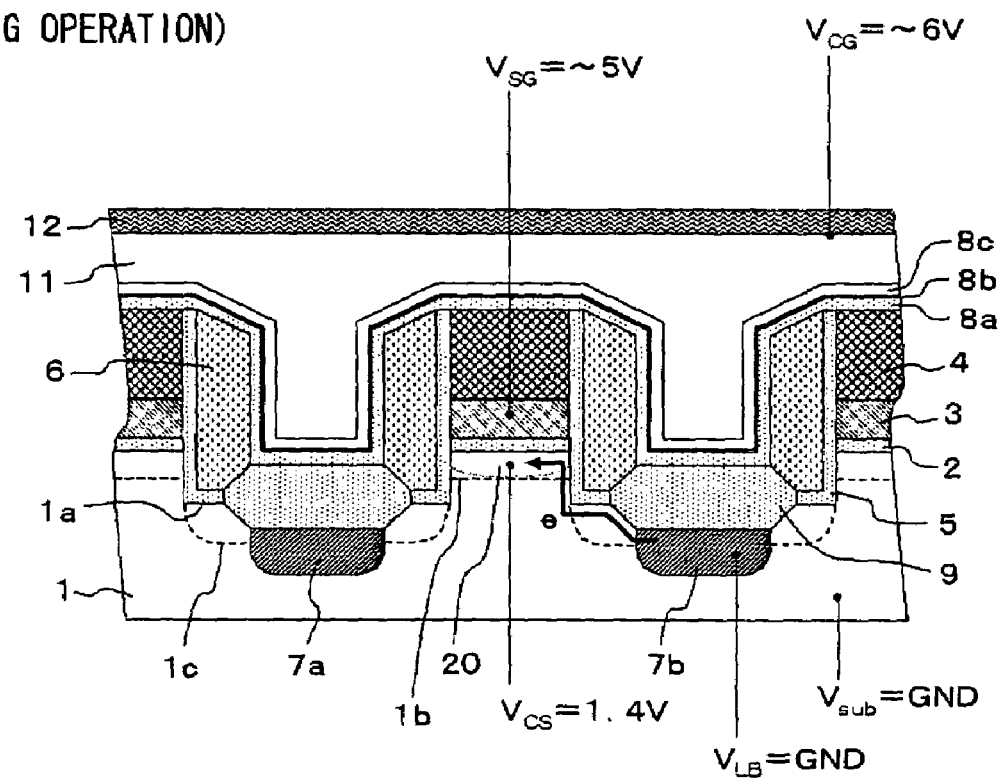
FIG. 9 is a drawing for explaining the reading operation (reading operation in the state where no electrons have accumulated in the floating gate) of the semiconductor-memory device of the first embodiment of the invention.
Figure 10:
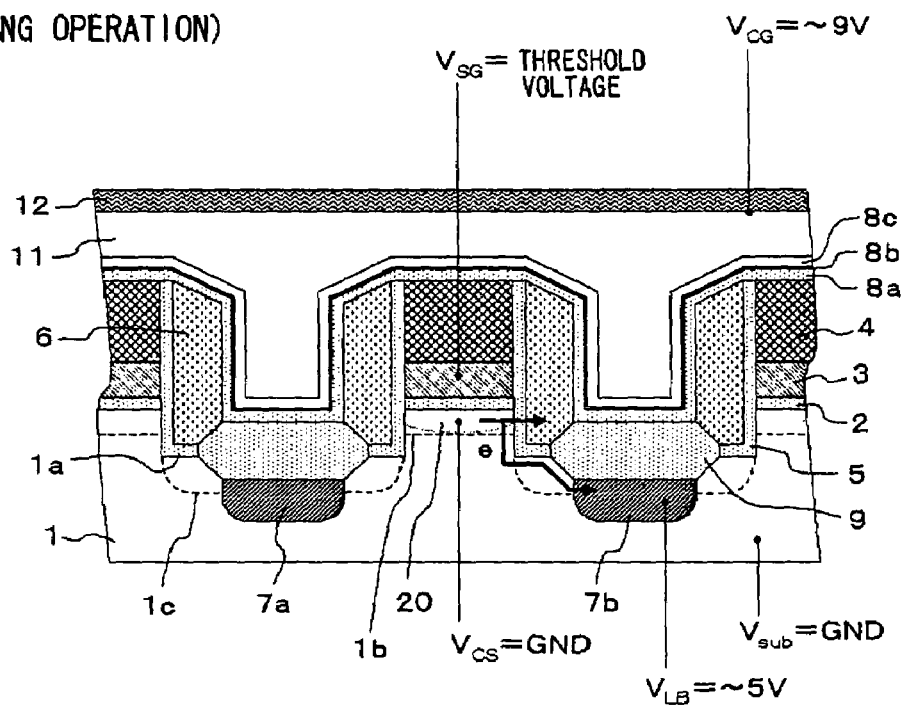
FIG. 10 is a drawing for explaining the writing operation of the semiconductor-memory device of the first embodiment of the invention.
Figure 11:
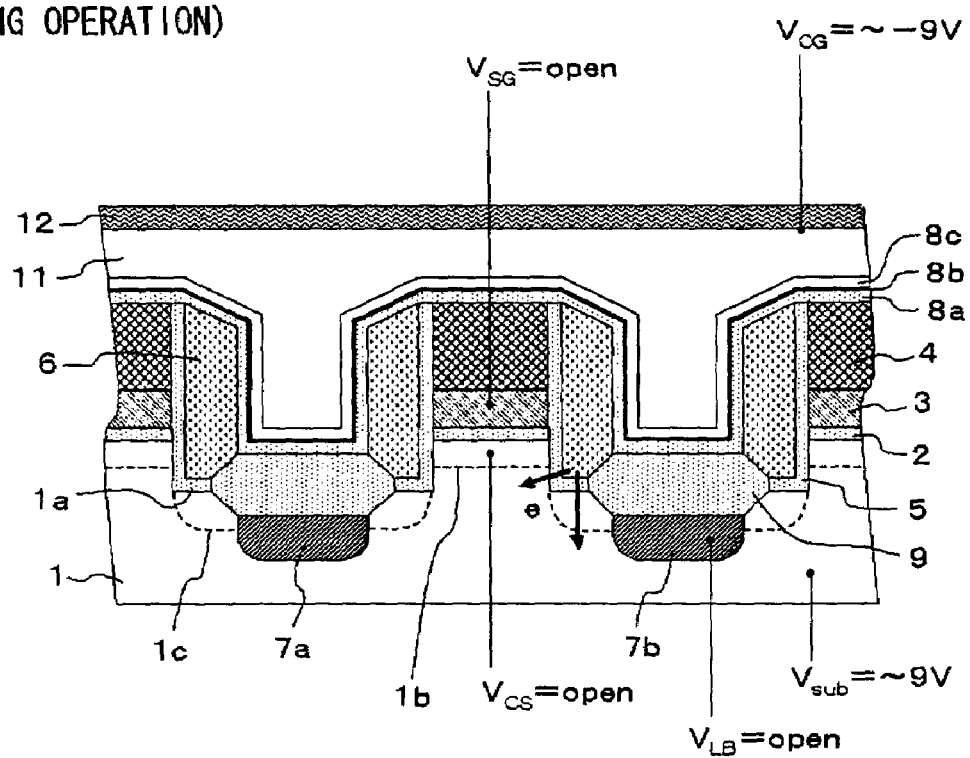
FIG. 11 is a drawing for explaining the erasing operation of the semiconductor-memory device of the first embodiment of the invention.

Next, the operation of the semiconductor-memory device of this first embodiment of the invention will be explained using the drawings. FIG. 9 is a drawing for explaining a first reading operation (reading operation in a state where no electrons have accumulated in the floating gate) of the semiconductor-memory device of this first embodiment of the invention. FIG. 10 is a drawing for explaining a first writing operation of the semiconductor-memory device of this first embodiment of the invention. FIG. 11 is a drawing for explaining a first erasing operation of the semiconductor-memory device of this first embodiment of the invention.

Referencing FIG. 9, in the first reading operation, a positive voltage is applied to the control gate 11, selector gate 3 and third diffusion area 21 of the cell to be read. For example, a voltage $V_{CG}=6V$ is applied to the control gate 11, a voltage $V_{SG}=5V$ is applied to the selector gate 3, and a voltage $V_{CS}=1.4V$ is applied to the third diffusion area 21 (embedded diffusion layer) that will be the drain side, and ground potential (GND=0V) is applied to the second diffusion area 7b (local-bit line) that will be the source side, and to the substrate 1. By doing this, in the state where no electrons have accumulated in the floating gate 6 (erasing state: low threshold voltage), electrons e move from the second diffusion area 7b and move through the channel area directly below and near the sidewalls of the floating gate 6, then move along the inversion layer 20 that is formed below the selector gate 3 to the third diffusion area (21 in FIG. 1) (see the 'Read Current Direction' in FIG. 8). On the other hand, in the state where electrons have accumulated in the floating gate 6 (write state: high threshold voltage), there is no channel below the floating gate so electrons e do not flow (no shown in the figure). Reading is performed by determining data (0/1) by whether or not electrons e flow.

Referring to FIG. 10, in the first writing operation, a high positive voltage is applied to the control gate 11 and second diffusion area 7b of the cell being written to, and a low positive voltage is applied to the selector gate 3 just enough so that a current of 1 μA flows in the memory cell. For example, a voltage $V_{CG}=9V$ is applied to the control gate 11, a voltage VSG=threshold voltage (or a specified voltage that is higher, by a specified difference, than the threshold voltage; for example 2V) is applied to the selector gate 3, a voltage $V_{LB}=5V$ is applied to the second diffusion area 7b (local-bit line) that will become the drain side, and ground potential (GND=0V) is applied to the third diffusion layer 21 (embedded diffusion layer) that will become the source side, and to the substrate 1. By doing this, electrons e move from the third diffusion layer (21 in FIG. 1) and along the inversion layer 20 that is formed below the selector gate 3, then move along the channel area near the sidewall and directly below the floating gate 6 to the second diffusion layer 7b. As this happens, part of the electrons e have high energy at the boundary between the selector gate 3 and floating gate 6, so they pass through the tunnel oxide film 5 near the sidewall and directly below the floating gate 6 (mainly the sidewall) and enter into the floating gate 6 (see 'Write Current Direction' in FIG. 8). Here, the concentration of electric field is generated at these boundaries due to the large difference between the channel resistance below the selector gate 3 and the channel resistance near the sidewall and directly below the floating gate 6. With this concentration of electric field, writing is performed by the electrons accelerating and entering into the floating gate 6.

Referring to FIG. 11, in the erasing operation, high negative voltage is applied to the control gate 11, and high positive voltage is applied to the substrate 1. For example, a voltage $V_{CG=-9}$ V is applied to the control gate 11, a voltage $V_{sub=9V}$ is applied to the substrate 1, and the second diffusion area 7b (local-bit line), selector gate 3 and third diffusion area 21 (embedded diffusion layer) are open. By doing this, electrons e are drawn from the floating gate 6 and through the tunnel oxide film 5 directly below and on the sidewall of the floating gate 6 to the substrate 1.

Figure 12:
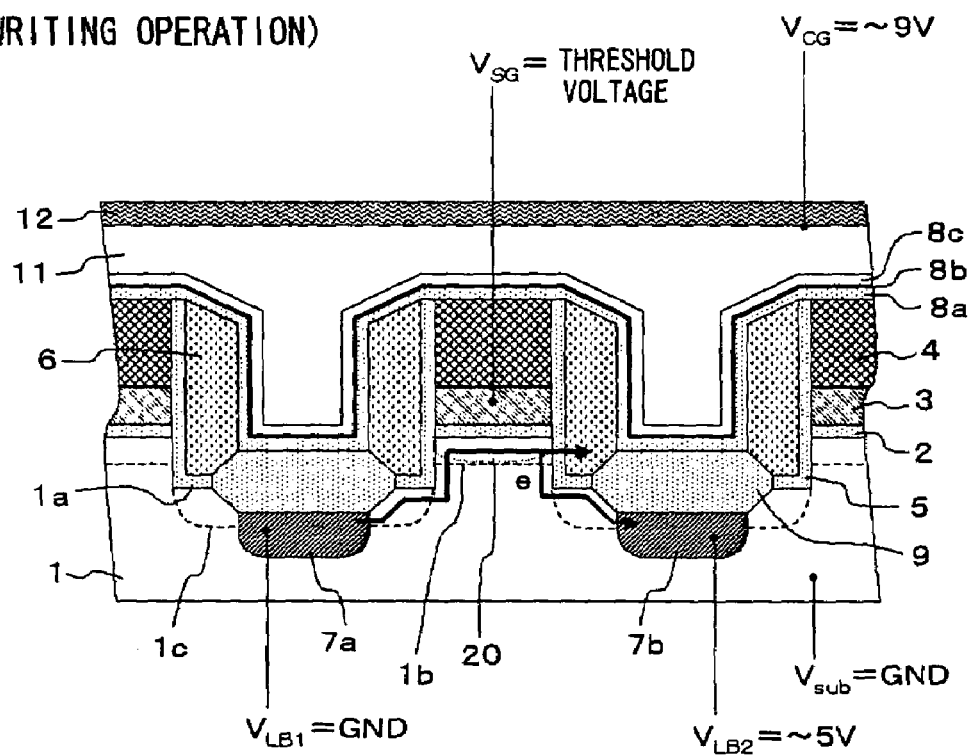
FIG. 12 is a drawing for explaining a second writing operation of the semiconductor-memory device of the first embodiment of the invention.
Figure 13:
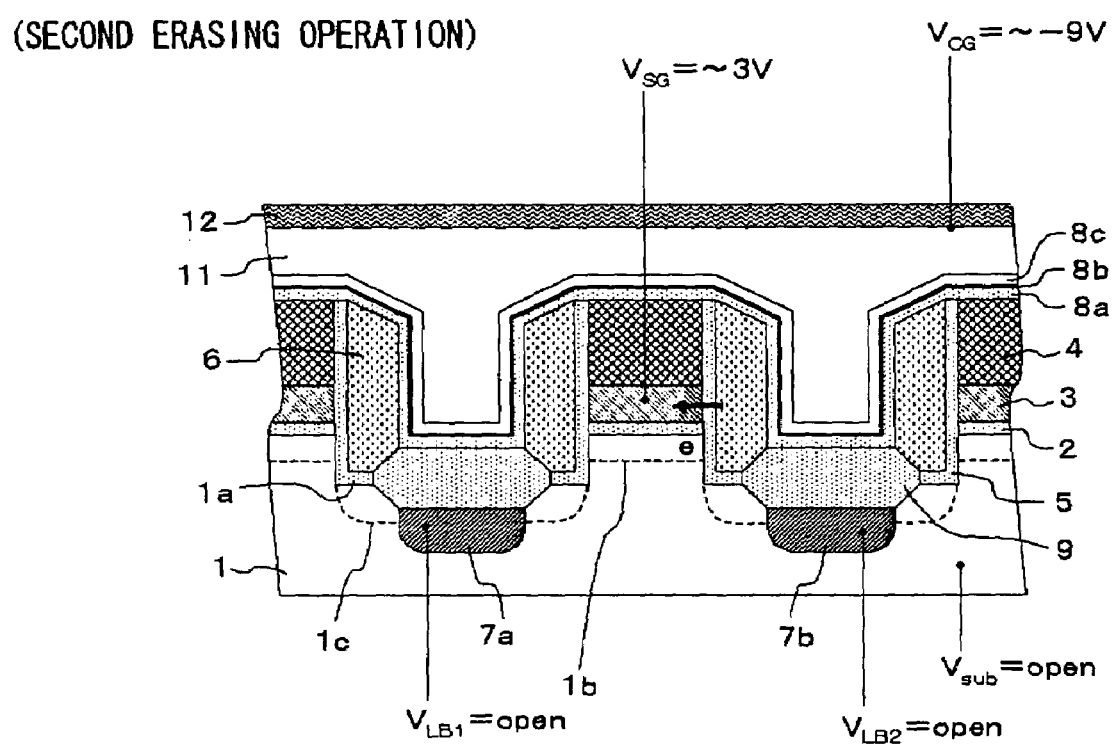
FIG. 13 is a drawing for explaining a second erasing operation of the semiconductor-memory device of the first embodiment of the invention.
Figure 14:
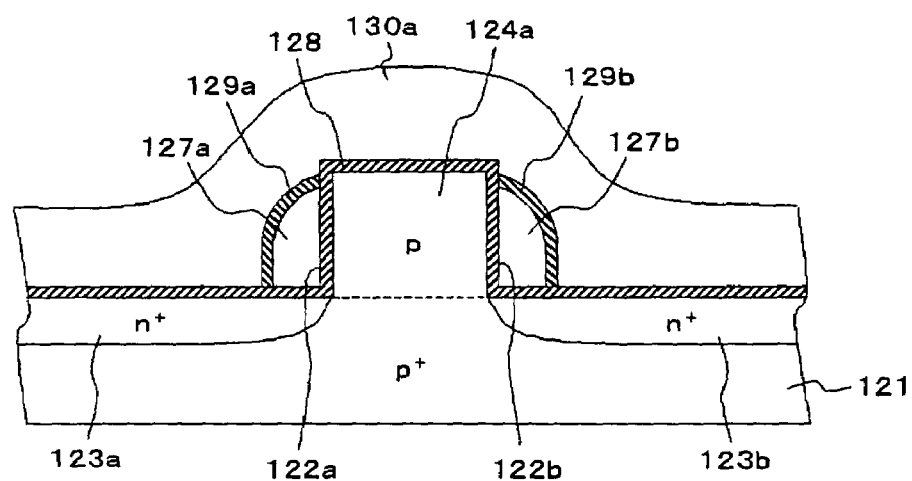
FIG. 14 is a partial cross-sectional view that schematically shows the construction of the semiconductor-memory device of prior art 1.
Figure 15:
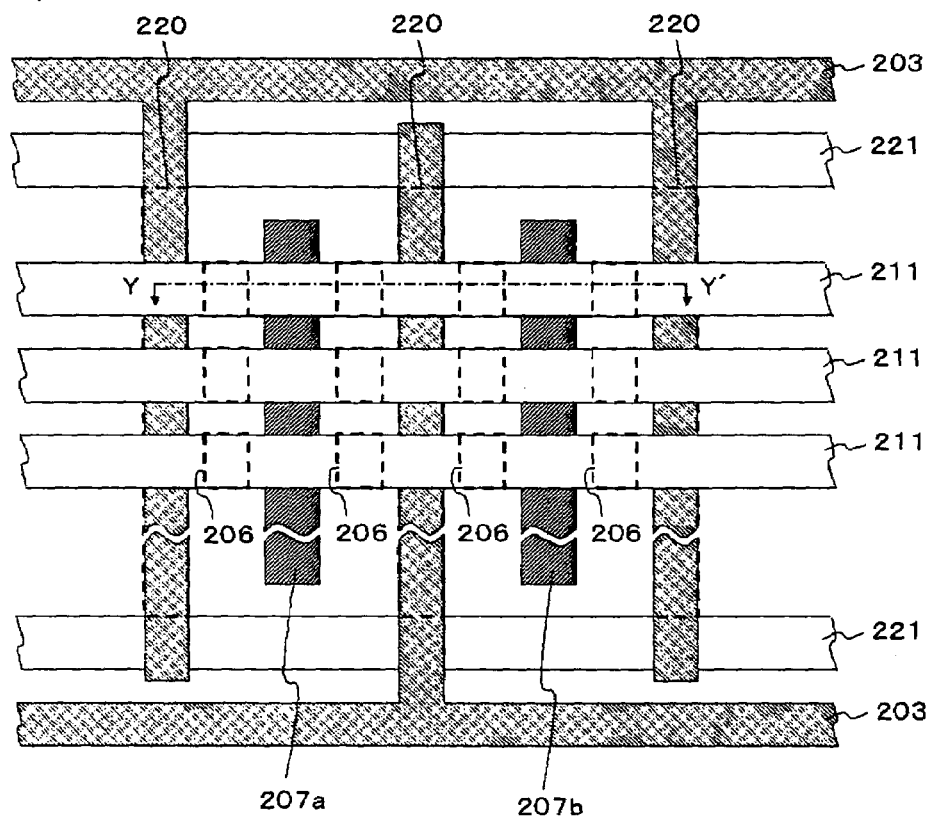
FIG. 15 is a partial cross-sectional view that schematically shows the construction of the semiconductor-memory device of prior art 2.
Figure 16:
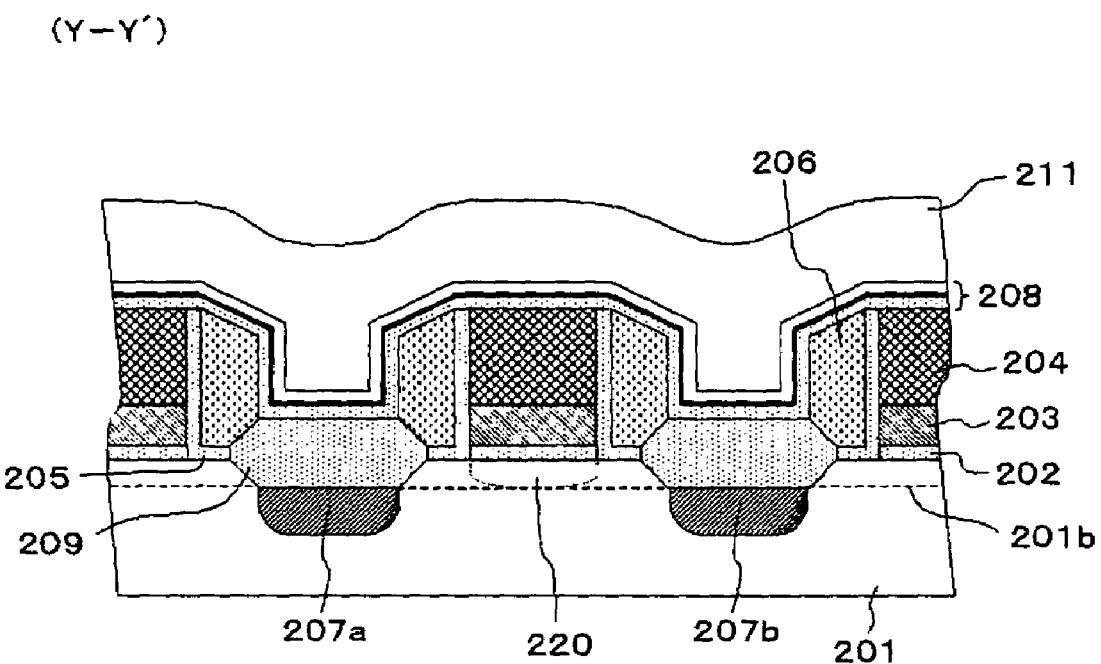
FIG. 16 is a partial cross-sectional view of section Y-Y' in FIG. 15 that schematically shows the construction of the semiconductor-memory device of prior art 2.
Figure 17:
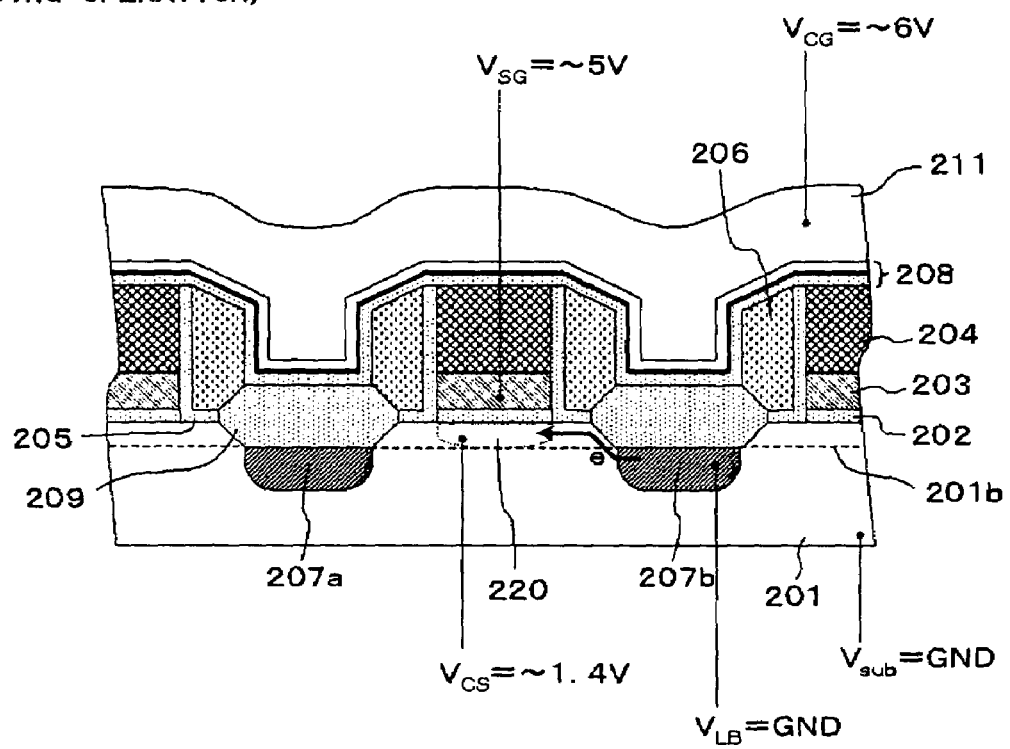
FIG. 17 is a drawing for explaining the reading operation (reading operation in the state where no electrons have accumulated in the floating gate) of the semiconductor-memory device of prior art 2.
Figure 18:
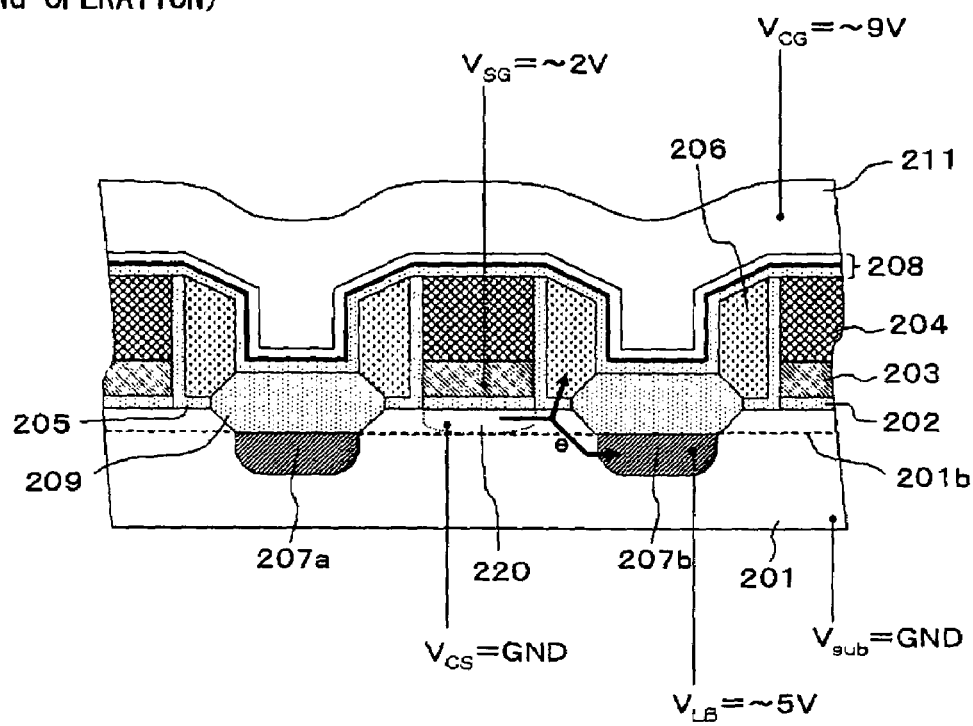
FIG. 18 is a drawing for explaining the writing operation of the semiconductor-memory device of prior art 2.
Figure 19:
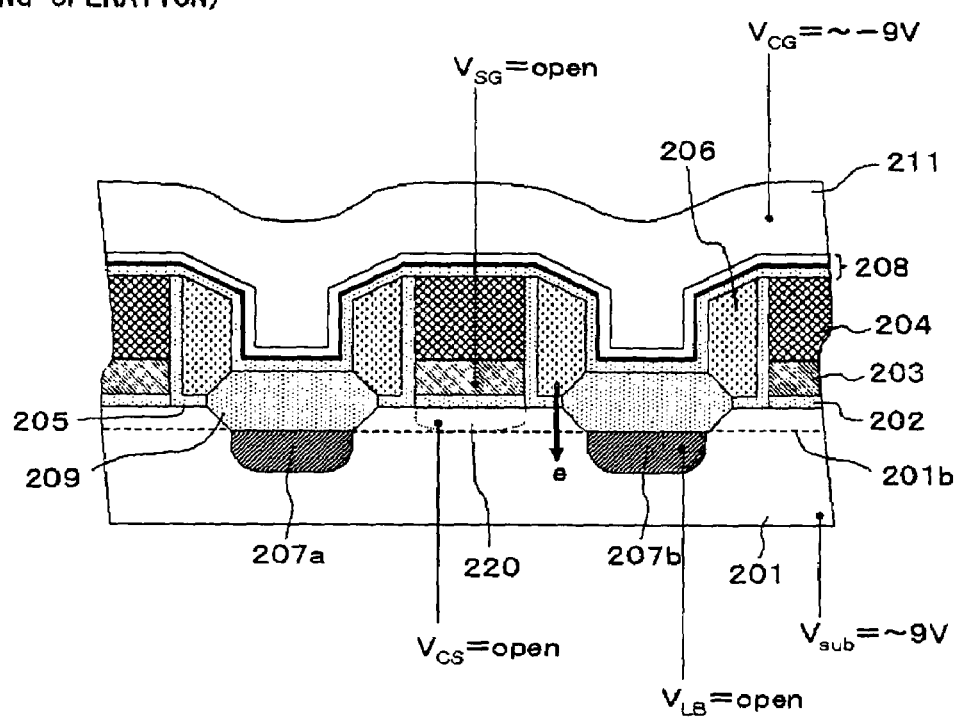
FIG. 19 is a drawing for explaining the erasing operation of the semiconductor-memory device prior art 2.

Next, a different writing operation and erasing operation of the semiconductor-memory device of this first embodiment of the invention will be explained using the drawings. FIG. 12 is a drawing for explaining a second writing operation of the semiconductor-memory device of this first embodiment of the invention. FIG. 13 is a drawing for explaining a second erasing operation of the semiconductor-memory device of this first embodiment of the invention.

Referring to FIG. 12, in the second writing operation, a high positive voltage is applied to the control gate 11 of the cell to be written to, and a low positive voltage that is just enough for a current of 1 µA to flow in the memory cell is applied to the selector gate 3. For example, a voltage $V_{CG=9V}$ is applied to the control gate 11, a voltage $V_{LB2=5V}$ is applied to the second diffusion area 7b (local-bit line) that will become the drain side, the threshold voltage (or a specified voltage higher than the threshold voltage) is applied to the selector gate 3, and ground potential (GND=0) is applied to the first diffusion area 7a (local-bit line) that will become the source side, and to the substrate 1. By doing this, electrons e move from the first diffusion area 7a and pass along the inversion layer (area) 20 that is formed below the selector gate 3 without going through the data state of the channel below the floating gate 6 on the side of the first diffusion area 7a, then pass along the channel area near the sidewall and directly below the floating gate 6 to the second diffusion area 7b. As this happens, some of the electrons e have high energy due to the electric field at the border between the selector gate 3 and the floating gate 6, so they pass through the tunnel oxide film 5 on the sidewall and directly below the floating gate 6 (mainly the sidewall) on the side of the second diffusion area 7b and enter into the floating gate 6. At this time, the current flowing in the channel of the selector gate 3 is restricted by the voltage VSG of the selector gate 3. Also, since the channel resistance of the selector gate 3 is higher than in other areas, the electric field is concentrated at the border between the channel of the selector gate 3 and the channel of the floating gate 6. The electrons at the border between the selector gate 3 channel and the floating gate 6 channel, where the electric field is concentrated, are accelerated and pass from the first diffusion area 7a on the source side of the floating gate 6 and enter the floating gate 6, and writing is performed. By doing this, the diffusion areas 7a, 7b that are used as the source and drain have lower resistance than the source line that uses the inversion layer of the selector gate 3, so it is possible to reduce the fluctuation in the voltage applied between the source and drain of the cell due to the bit position. This means that it is possible to suppress fluctuation in the writing characteristics due to the bit position in the memory cell array, and as a result, it is possible to reduce the slow bits in writing and thus increase the speed of writing to a memory block.

Referring to FIG. 13, in the erasing operation a high negative voltage is applied to the control gate 11, and a positive voltage is applied to the selector gate 3. For example, a voltage $V_{CG=-9V}$ is applied to the control gate 11, a voltage $V_{SG=3V}$ is applied to the selector gate 3, and the first diffusion area 7a, second diffusion area 7b (local-bit lines), substrate 1 and the third diffusion area (21 in FIG. 1) are open. By doing this, electrons e are drawn from the floating gate 6 and through the tunnel oxide film 5 on the sidewall of the floating gate 6 to the selector gate 3.

This first embodiment of the invention has the following effects.

The first effect is that it is possible to reduce leak off from the memory cell. The reason for this is that even though the cell size is made smaller, the channel (channel near the sidewall of the floating gate 6) exists in the height direction. This makes it possible to effectively lengthen the channel, so it is possible to reduce leak off from the memory cell.

The second effect is that punch through across the drain and source during writing (first writing operation) is suppressed. The reason for this is that the first diffusion area 7a and second diffusion area 7b on the drain side are located at a physically lower position than the inversion layer 20 on the source side, so it is possible to set the impurity density of the second well 1c below the floating gate 6 (area between the inversion layer 20 and the second diffusion area 7b) without affecting the first well 1b below the selector gate 3 (area where the inversion layer 20 is formed). The impurity density of the second well 1c can be set to be more dense than the impurity density of the first well 1b, which is advantageous in suppressing punch through. Also, it is effective in improving the ON current Ion of the memory cell. The reason for this is that the impurity density of the first well 1b below the selector gate 3 (area where the inversion layer 20 is formed) can be set to be less dense than the impurity density of the second well 1c below the floating gate 6 (area between the inversion layer 20 and the second diffusion area 7b), so it is possible to lower the channel resistance below the selector gate 3. In other words, it is possible to prevent punch through increasing the impurity density of the second well 1c below the floating gate 6 (area between the inversion layer 20 and the second diffusion area 7b), and it is possible to lower the threshold value of the selector gate 3 and to lower the channel resistance of the selector gate 3 by decreasing the impurity density of the first well 1b below the selector gate 3 (area where the inversion layer 20 is formed). This makes it possible to improve the current when reading a memory cell.

The third effect is that in two unit cells that share the same selector gate 3, when writing to the memory node of one of the unit cells, the memory node of the other unit cell is not written to. The reason for this is that channel current does not flow between the diffusion areas 7a, 7b of the two unit cells.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor-memory device comprising as one cell unit:
   a substrate having a trench section of a specified depth;
   a selector gate that is located via a first insulating film in a first area on said substrate that is adjacent to said trench section;

a first well, comprising implanted ions, that is formed on a surface of said substrate below said selector gate;

a floating gate that is located via a second insulating film in a second area on a surface of a bottom section and sidewall of said trench section that is adjacent to said first area;

a second well, comprising implanted ions, that is formed on the surface of the bottom section of said trench section that is below said floating gate;

a first diffusion area that is formed in a third area on the surface of the bottom section of said trench section and adjacent to said second area; and a control gate that is located via a third insulating film on top of said floating gate, wherein said control gate three-dimensionally crosses over said selector gate, wherein a second diffusion area is formed in a fourth area on the surface of said substrate located in an extending section of said selector gate, wherein an area near a sidewall surface and the bottom surface of said trench section in said selector gate forms a channel, and wherein an impurity density of said first well is not more than an impurity density of said second well.

2. The semiconductor-memory device of claim 1, further comprising a fourth insulating film that is located on top of said selector gate, wherein said trench section is created by self alignment with said fourth insulating film as a mask.

3. The semiconductor-memory device of claim 1, wherein the depth of said trench section is not less than 50 nm and not more than 100 nm from the surface of said substrate.

4. The semiconductor-memory device of claim 1, wherein said first diffusion area is created by self alignment with said selector gate and said floating gate as a mask.

5. The semiconductor-memory device of claim 1, wherein said third insulating film comprises a layered dielectric film having a silicon oxide film, silicon nitride film, and silicon oxide film layered in that order.

6. The semiconductor-memory device of claim 1, wherein a cell is read by:
applying a specified positive voltage to said control gate;
applying a specified positive voltage to said selector gate;
applying a specified positive voltage to said second diffusion area that will become a drain side; and
applying ground potential to said first diffusion area that will become a source side, and to said substrate.

7. The semiconductor-memory device of claim 1, wherein a cell is written to by:
applying a specified positive voltage to said control gate;
applying a threshold voltage or a specified voltage that is higher than the threshold voltage to said selector gate;
applying a specified positive voltage to said first diffusion area that will become a drain side; and
applying ground potential to said second diffusion area that will become a source side, and to said substrate.

8. The semiconductor-memory device of claim 1, wherein a cell is erased by:
applying a specified negative voltage to a said control gate; and
applying a specified positive voltage to said substrate.

9. The semiconductor-memory device of claim 1, wherein a cell is erased by:
applying a specified negative voltage to said control gate; and
applying a specified positive voltage to said selector gate.

10. The semiconductor-memory device of claim 1, wherein writing to a cell is performed by:
applying a specified positive voltage to said control gate;
applying the threshold voltage or a specified voltage higher than the threshold voltage to said selector gate;
applying a specified positive voltage to said second diffusion area that will become a drain side; and
applying ground potential to said first diffusion area that will become a source side, and to said substrate.

11. The semiconductor-memory device of claim 1, wherein a channel is formed on a surface layer of said substrate directly below said selector gate and forms a path that connects said second diffusion area with said first diffusion layer, and wherein said channel is shaped as seen from above said substrate so that said channel comprises:
a first path that extends from a side of said third diffusion area along a lengthwise direction of said selector gate; and
a second path, which extends along the lengthwise direction of said selector gate and is bent directly below selected said control gate, and extends in a direction that is orthogonal to said first path toward said first diffusion area.

12. The semiconductor-memory device of claim 1, wherein the impurity density of said second well is more than the impurity density of said first well.

13. A semiconductor-memory device comprising:
a substrate in which a first trench section and second trench section having a specified depth are placed so that they are separated from and parallel to each other;
a selector gate that is located via a first insulating film in a first area on said substrate adjacent to said first trench section and second trench section;
a first well, comprising implanted ions, that is formed on a surface of said substrate below said selector gate;
a first floating gate that is located via a second insulating film in a second area on a surface of a bottom section and sidewall section of said first trench section that are adjacent to said first area;
a second floating gate that is located via a third insulating film in a third area on a surface of a bottom section and sidewall section of said second trench section and that is adjacent to said first area;
a second well, comprising implanted ions, that is formed on the surface of the bottom section of said first trench section below said first floating gate, and located on the surface of the bottom section of said second trench section below said second floating gate;
a first diffusion area that is adjacent to said first well and is formed on the surface of the bottom section of said first trench section;
a second diffusion area that is adjacent to said first well and is formed on the surface of the bottom section of said second trench section;
a fourth insulating film that is located on top of said selector gate;
a control gate that is located via a fifth insulating film on top of said first floating gate, said second floating gate and said fourth insulating film; and
a third diffusion area that is located in a fourth area on the surface in an extended section of said selector gate and extends in a direction that crosses said selector gate, wherein said first diffusion area, said first floating gate, said control gate and said selector gate form a first unit cell, wherein said second diffusion area, said second floating gate, said control gate and said selector gate form a second unit cell, wherein an area near the surfaces of the sidewall and bottom surface of said first trench section and said second trench section in said selector gate forms a channel, and wherein an impurity density of said first well is not more than an impurity density of said second well.

14. The semiconductor-memory device of claim 13, wherein a channel is formed on a surface layer of said substrate directly below said selector gate and forms a path that connects said third diffusion area with either said first diffusion layer or said second diffusion layer, and is shaped as seen from above said substrate so that it has:
  a first path that extends from a side of said third diffusion area along a lengthwise direction of said selector gate; and
  a second path, which extends along the lengthwise direction of said selector gate and is bent directly below selected said control gate, and extends in a direction that is orthogonal to said first path toward either said first diffusion area or second diffusion area.

15. The semiconductor-memory device of claim 14, wherein writing to a cell is performed by:
  applying a specified positive voltage to said control gate;
  applying the threshold voltage or a specified voltage higher than the threshold voltage to said selector gate;
  applying a specified positive voltage to said second diffusion area that will become a drain side; and
  applying ground potential to said first diffusion area that will become a source side, and to said substrate.

16. The semiconductor-memory device of claim 13, wherein a channel is formed on a surface layer of said substrate directly below said selector gate and forms a path that connects said third diffusion area with either said first diffusion layer or said second diffusion layer, and is shaped as seen from above said substrate so that said channel comprises a path that extends from a side of said third diffusion area along a lengthwise direction of said selector gate.

17. The semiconductor-memory device of claim 13, wherein the impurity density of said second well is more than the impurity density of said first well.

18. A semiconductor-memory device comprising:
  trenches having a specified depth;
  an embedded diffusion area that is deeper than a bottom section of said trenches;
  an embedded selector gate between said trenches and having a depth that is shallower than said specified depth;
  a first well, comprising implanted ions, located directly below said selector gate;
  a memory node extending from a side surface running along an extended direction of said selector gate and passing over a side surface of one of said trenches to reach a bottom surface of said one of said trenches; and
  a second well, comprising implanted ions, located in a area directly below said selector gate and adjacent to said diffusion area; and
  a control node that controls said selector gate and said memory node,
  wherein an impurity density of said second well is not less than an impurity density of said first well.

19. The semiconductor-memory device of claim 18, wherein the impurity density of said second well is more than the impurity density of said first well.

\* \* \* \* \*